(12) United States Patent
Miyoshi et al.

(10) Patent No.: US 9,070,559 B2
(45) Date of Patent: Jun. 30, 2015

(54) PATTERN FORMING METHOD AND METHOD OF MANUFACTURING SEMICONDUCTOR DEVICE

(71) Applicant: Kabushiki Kaisha Toshiba, Minato-ku (JP)

(72) Inventors: Seiro Miyoshi, Yokkaichi (JP); Maki Miyazaki, Yokkaichi (JP); Kentaro Matsunaga, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/196,239

(22) Filed: Mar. 4, 2014

(65) Prior Publication Data

US 2015/0031198 A1  Jan. 29, 2015

Related U.S. Application Data

(60) Provisional application No. 61/858,201, filed on Jul. 25, 2013.

(30) Foreign Application Priority Data

Nov. 22, 2013  (JP) .................................. 2013-242159

(51) Int. Cl.
| | | |
|---|---|---|
| *H01L 21/44* | (2006.01) | |
| *H01L 21/033* | (2006.01) | |
| *H01L 21/28* | (2006.01) | |
| *H01L 21/308* | (2006.01) | |
| *H01L 21/3213* | (2006.01) | |

(Continued)

(52) U.S. Cl.
CPC ...... *H01L 21/0337* (2013.01); *H01L 21/28273* (2013.01); *H01L 21/3086* (2013.01); *H01L 21/0338* (2013.01); *H01L 21/32139* (2013.01); *H01L 21/0271* (2013.01); *H01L 27/11524* (2013.01)

(58) Field of Classification Search
CPC ............ H01L 21/0337; H01L 21/0338; H01L 21/0332; H01L 21/0271; H01L 21/0273; H01L 21/3086; H01L 21/312; H01L 21/32139; H01L 27/11521; H01L 27/11524; H01L 27/11526
USPC .......................... 438/696, 669, 671, 736, 594; 257/E21.039
See application file for complete search history.

(56) References Cited

U.S. PATENT DOCUMENTS

| | | |
|---|---|---|
| 5,236,853 A | 8/1993 | Hsue |
| 5,429,988 A | 7/1995 | Huang et al. |

(Continued)

FOREIGN PATENT DOCUMENTS

| | | |
|---|---|---|
| JP | 2007-43167 | 2/2007 |
| JP | 2008-512002 | 4/2008 |

(Continued)

*Primary Examiner* — Michael Trinh
(74) *Attorney, Agent, or Firm* — Oblon, McClelland, Maier & Neustadt, L.L.P.

(57) ABSTRACT

According to one embodiment, first, a core pattern is formed above a hard mask layer that is formed above a process object. Then, a spacer film is formed above the hard mask layer. Next, the spacer film is etch-backed. Subsequently, an embedded layer is embedded between the core patterns whose peripheral areas are surrounded by the spacer film. Then, the core pattern and the embedded layer are removed simultaneously. Subsequently, using the spacer pattern as a mask, the hard mask layer and the process object are processed.

6 Claims, 9 Drawing Sheets

(51) Int. Cl.
*H01L 21/027* (2006.01)
*H01L 27/115* (2006.01)

(56) References Cited

U.S. PATENT DOCUMENTS

| | | | |
|---|---|---|---|
| 5,618,383 A * | 4/1997 | Randall | 430/314 |
| 7,732,338 B2 | 6/2010 | Narita | |
| 8,142,986 B2 | 3/2012 | Sim et al. | |
| 8,303,831 B2 | 11/2012 | Kim | |
| 2007/0023916 A1 | 2/2007 | Hah et al. | |
| 2009/0263749 A1 * | 10/2009 | Sim et al. | 430/319 |
| 2011/0193151 A1 * | 8/2011 | Sakamoto | 257/316 |
| 2012/0282778 A1 * | 11/2012 | Light et al. | 438/703 |

FOREIGN PATENT DOCUMENTS

| | | |
|---|---|---|
| JP | 2009-94379 | 4/2009 |
| JP | 2009-99792 | 5/2009 |
| JP | 2009-260309 | 11/2009 |
| JP | 2011-171642 | 9/2011 |
| JP | 2013-102038 | 5/2013 |
| WO | 2006/026699 A2 | 3/2006 |

* cited by examiner

PATTERN FORMING METHOD AND METHOD OF MANUFACTURING SEMICONDUCTOR DEVICE

CROSS-REFERENCE TO RELATED APPLICATIONS

This application is based upon and claims the benefit of priority from U.S. Provisional Application No. 61/858,201, filed on Jul. 25, 2013, and Japanese Patent Application No. 2013-242159, filed on Nov. 22, 2013; the entire contents of all of which are incorporated herein by reference.

FIELD

Embodiments described herein relate generally to a pattern forming method and a method of manufacturing a semiconductor device.

BACKGROUND

In accordance with a demand for scaling of devices, the scaling of lithography has accelerated. Accordingly, a pitch required for a pattern has been smaller than a limit that can be resolved by a current exposure device (for example, an ArF immersion exposure device). In this case, one execution of lithography cannot form a pattern with a desired fine pitch. A spacer process (sidewall transfer process) is known. In a positive process where a foundation layer is processed using the spacer pattern as a mask, first, a hard mask layer is formed on a film to be processed, and then a core of a predetermined shape is formed on the hard mask layer. Next, a spacer is formed around the core, and an upper portion of the spacer is removed. Afterwards, the core is removed. By processes described above, the spacer pattern is formed. Then, using the spacer pattern as a mask, the hard mask layer is processed. Using the hard mask layer as a mask, the film to be processed, which serves as a foundation layer, is processed. Thus, a pattern is formed.

However, with the conventional spacer process, in the case where the spacer pattern is constituted of a film with comparatively small rigidity, for example, there may be a case that the spacer pattern is internally inclined toward a side where the core was present in removal of the core. If the hard mask layer is processed using the spacer pattern thus internally inclined, the hard mask layer is also inclined similarly to the spacer pattern. If the inclination is significant, the upper portion of the hard mask layer could be obstructed. Thus, formation of the inclined spacer pattern fails to form a satisfactory pattern on a film to be processed. A need thus exists for the spacer pattern that is vertically formed to a face of the film to be processed.

DETAILED DESCRIPTION

In general, according to one embodiment, first, a hard mask layer is formed above a process object. Then, a core pattern with a predetermined shape is formed above the hard mask layer. Then, a spacer film is formed above the hard mask layer with the core pattern. Next, the spacer film is etch-backed such that a top face of the core pattern is exposed and a top face of the hard mask layer between the core patterns is exposed. Afterwards, an embedded layer is formed above the hard mask layer such that between the core patterns whose peripheral areas are surrounded by the spacer film is embedded. Then, the core pattern and the embedded layer are removed simultaneously to form a spacer pattern including the spacer film. Afterwards, using the spacer pattern as a mask, the hard mask layer is processed. Furthermore, using the processed hard mask layer as a mask, a pattern is formed on the process object.

Exemplary embodiments of pattern forming method and method of manufacturing semiconductor device will be explained below in detail with reference to the accompanying drawings. The present invention ia not limited to the following embodiments. Cross-sectional views of the semiconductor device used in the following embodiments are schematic. Therefore, a relationship between a thickness and a width of a layer, a ratio of thickness among the respective layers, and similar specification may differ from the actual ones. Furthermore, the following describes an exemplary film thickness. This should not be construed in a limiting sense.

(First Embodiment)

The following describes a case where the embodiment is applied to a NAND flash-memory device as a non-volatile semiconductor memory device. The NAND flash-memory device includes a memory cell area and a peripheral circuit area. The memory cell area includes a large number of memory cell transistors (hereinafter referred to as memory cells) disposed in a matrix pattern. The peripheral circuit area includes a peripheral circuit transistor to drive the memory cells.

Figure 1:
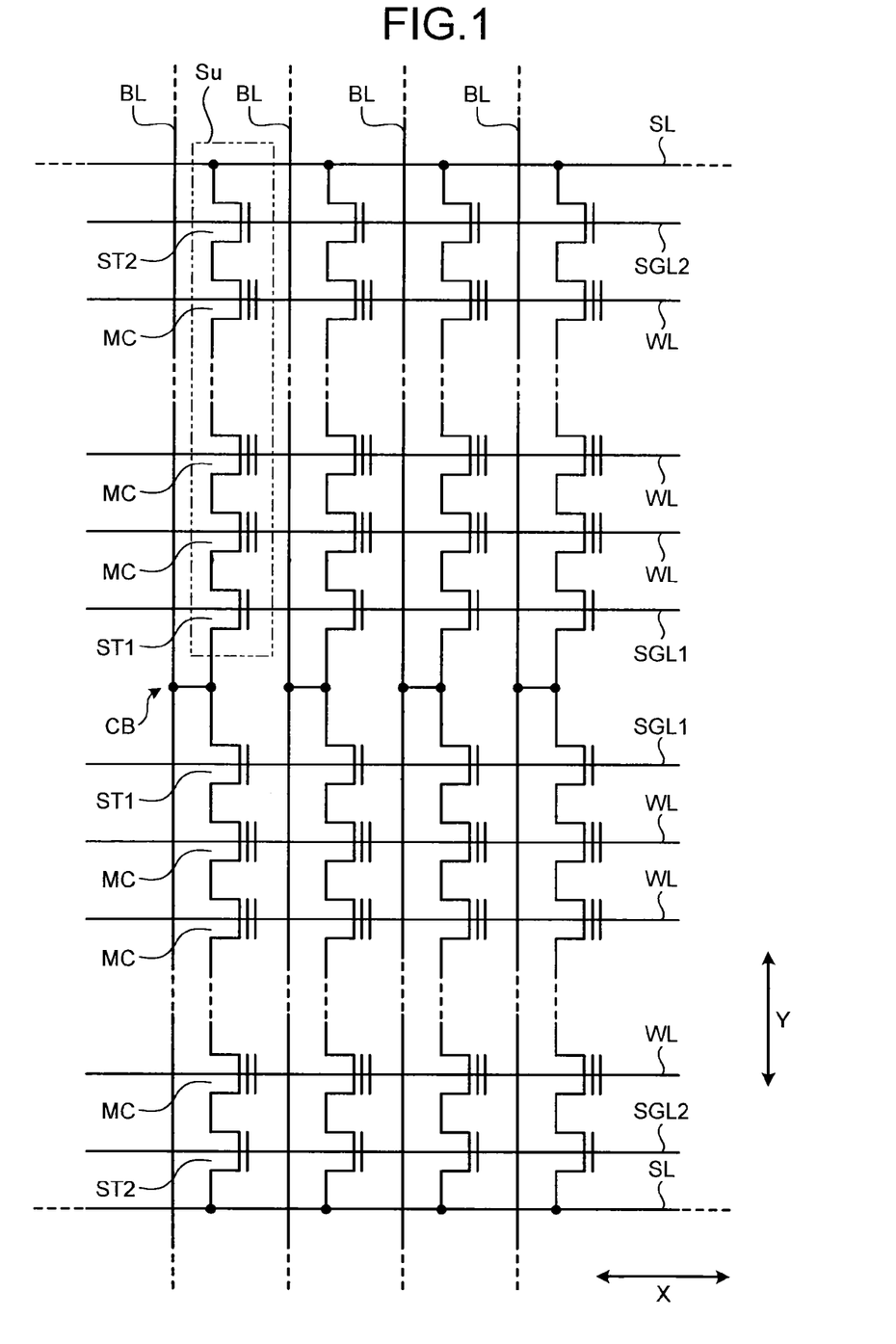
FIG. 1 is an equivalent circuit diagram illustrating a part of a memory cell array formed in a memory cell area of a NAND flash-memory device.

FIG. 1 is an equivalent circuit diagram illustrating a part of a memory cell array formed in the memory cell area of the NAND flash-memory device. The memory cell array of the NAND flash-memory device is constituted by arranging NAND cell units (memory units) Su in matrix shape. The NAND cell unit Su includes two selection gate transistors ST1 and ST2 and a memory cell column between the two selection gate transistors ST1 and ST2. The memory cell column includes a plurality of (for example, nth power of 2 pieces, where n is a positive integer) of memory cells MC coupled in series. In the NAND cell unit Su, the plurality of memory cells MC is formed so as to share a source/drain region between the memory cells MC adjacent to one another.

The memory cells MC arranged in the X direction in FIG. 1 (corresponds to a word line direction and a gate width direction) are coupled in common by a word line (control gate line) WL. The selection gate transistors ST1 arranged in the X direction in FIG. 1 are coupled in common by a selection gate line SGL1 while the selection gate transistors ST2 are coupled in common by a selection gate line SGL2. A bit line contact CB is coupled to a drain region of the selection gate transistor ST1. One end of the bit line contact CB is coupled to a bit line BL. The bit line BL extends in the Y direction orthogonal to the X direction in FIG. 1 (corresponds to a bit line direction and a gate length direction). The selection gate transistor ST2 is coupled to a source line SL extending in the X direction in FIG. 1 via the source region.

Figure 2:
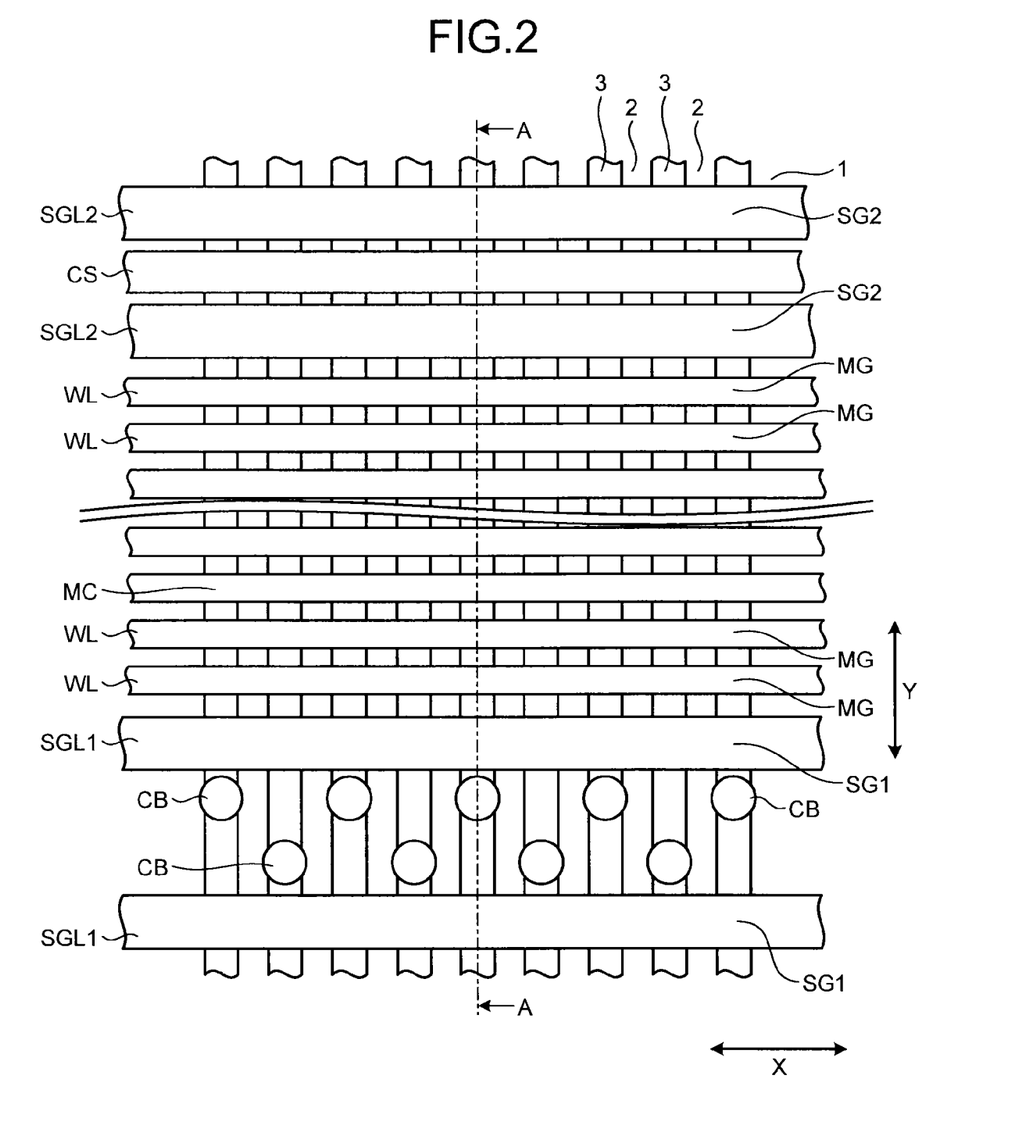
FIG. 2 is a plan view illustrating a layout pattern of a part of the memory cell area.

FIG. 2 is a plan view illustrating a layout pattern of a part of the memory cell area. A plurality of Shallow Trench Isolations (STIs) 2 as element isolation areas extends on a semiconductor substrate 1 in the Y direction in FIG. 2 at a predetermined spacing in the X direction. This separates adjacent active areas 3 in the X direction in FIG. 2. The word lines WL of the memory cells MC extend in the X direction in FIG. 2 orthogonal to the active areas 3, and are formed in a line and space pattern at a predetermined spacing in the Y direction.

The two selection gate lines SGL1 extending in the X direction in FIG. 2 are adjacently formed in parallel. The bit line contact CB is formed on each of the active areas 3 between the adjacent two selection gate lines SGL1. In this example, the bit line contacts CB are disposed in the adjacent active areas 3, alternately shifting positions along the Y direction. That is, between the two selection gate lines SGL1, the bit line contacts CB disposed close to the one selection gate line SGL1 side and the bit line contacts CB disposed close to the other selection gate line SGL1 side are disposed at alternately shifted positions, a so-called zigzag pattern.

The two selection gate lines SGL2 extending in the X direction in FIG. 2 are formed in parallel similarly to the case of the selection gate lines SGL1. The selection gate lines SGL2 are disposed at the position having the predetermined number of word lines WL from the selection gate lines SGL1. Then, a source line contact CS is disposed at the active area 3 between the two selection gate lines SGL2.

On the active areas 3 intersecting with the word lines WL, stacked gate structures MG of the memory cells MC are formed. On the active areas 3 intersecting with the selection gate lines SGL1 and SGL2, gate structures SG1 and SG2 of the selection gate transistors ST1 and ST2 are formed.

Figure 3:
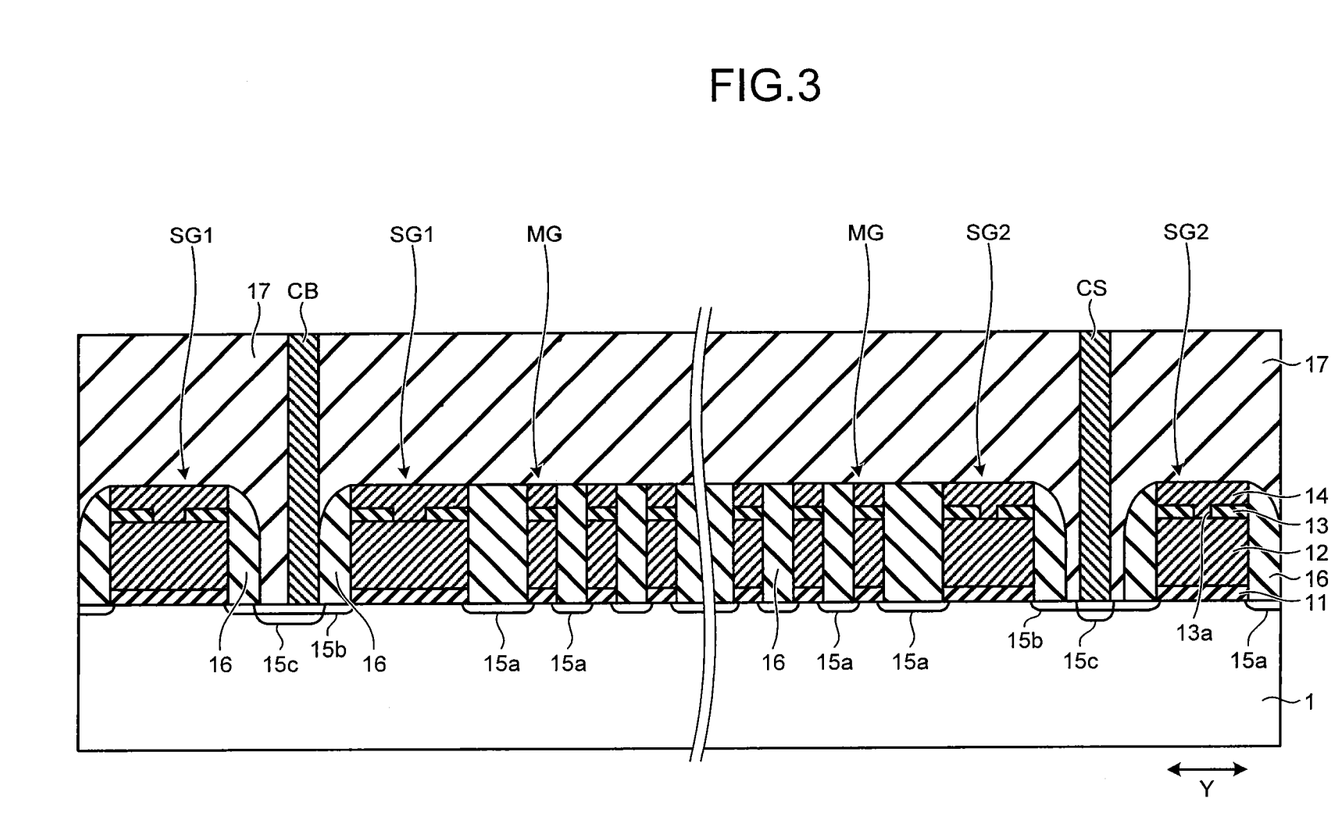
FIG. 3 is a cross-sectional view taken along the line A-A of FIG. 2.

FIG. 3 is a cross-sectional view taken along the line A-A of FIG. 2. That is, the gate structures SG1 and SG2 of the selection gate transistors ST1 and ST2 and the stacked gate structures MG of the memory cells MC disposed between the two selection gate transistors ST1 and ST2 in the active areas 3 are illustrated. In FIG. 3, the stacked gate structures MG of the memory cells MC formed on the semiconductor substrate 1 such as a silicon substrate and the gate structures SG1 and SG2 of the selection gate transistors ST1 and ST2 have a structure where a floating gate electrode film 12, an inter-electrode insulating film 13, and a control gate electrode film 14 are sequentially stacked on a tunnel insulating film 11. The inter-electrode insulating films 13 of the gate structures SG1 and SG2 of the selection gate transistors ST1 and ST2 include an opening 13a to conduct between the floating gate electrode film 12 and the control gate electrode film 14. The control gate electrode film 14 is embedded in the opening 13a. Accordingly, in the selection gate transistors ST1 and ST2, a gate electrode is constituted with the floating gate electrode film 12 and the control gate electrode film 14.

As the tunnel insulating film 11, a thermally-oxidized film, a thermal oxynitride film, a Chemical Vapor Deposition (CVD) oxidized film, a CVD oxynitride film, an insulating film sandwiching Si, an insulating film where Si are embedded in a dot pattern, or similar film may be used. As the floating gate electrode film 12, a polycrystalline silicon where N type impurities or P type impurities are doped, a metal film, a poly-metal film, or a nitride film using such as, for example, Mo, Ti, W, Al, or Ta, or similar film may be used. As the inter-electrode insulating film 13, a silicon oxide film, a silicon nitride film, an Oxide-Nitride-Oxide (ONO) film, which has a stacked structure of a silicon oxide film and a silicon nitride film, a high-dielectric-constant film such as an aluminum oxide film and a hafnium oxide film, a stacked structure of a low-dielectric-constant film such as a silicon oxide film or a silicon nitride film, and the high-dielectric-constant film, or similar film may be used. As the control gate electrode film 14, a polycrystalline silicon where N type impurities or P type impurities are doped, a metal film or a poly-metal film using, for example, Mo, Ti, W, Al, or Ta, a stacked structure of the polycrystalline silicon film and a metal silicide film, or similar film may be used.

Impurity diffused areas 15a, which become source/drain regions, are formed close to a surface of the semiconductor substrate 1 between the stacked gate structures MG and MG, and between the stacked gate structure MG and the gate structure SG1 or SG2. Impurity diffused areas 15b, which become source/drain regions similarly to the impurity diffused areas 15a, are respectively formed close to the surface of the semiconductor substrate 1 between the adjacent gate structures SG1 and SG1 and between SG2 and SG2.

Sidewall insulating films 16, which are, for example, formed of a silicon oxide film, are formed at sidewall faces between the adjacent pair of stacked gate structures MG and MG, between the stacked gate structure MG and the gate structure SG1 or SG2, between the gate structures SG1 and SG1, and between the gate structures SG2 and SG2. Here, between the stacked gate structures MG and MG and between the stacked gate structure MG and the gate structure SG1 or SG2, the sidewall insulating films 16 are formed so as to be embedded. Between the gate structures SG1 and SG1 and between the gate structures SG2 and SG2, the sidewall insulating films 16 are not completely embedded. The sidewall insulating films 16 are disposed on the opposed sidewall faces.

Impurity diffused areas 15c are formed close to the surface of the semiconductor substrate 1 between the gate structures SG1 and SG1 and between the opposed sidewall insulating films 16 which are disposed between the gate structures SG2 and SG2 to decrease a contact resistance of the bit line contact CB and a source line contact CS. The impurity diffused area 15c is formed to become a narrower width dimension and a deeper diffusion depth (a depth of pn bonding) than the impurity diffused area 15b. This constitutes a Lightly Doped Drain (LDD) structure.

Inter-layer insulating films 17 are formed above the stacked gate structures MG where the sidewall insulating films 16 are formed and above the gate structures SG1 and SG2. The bit line contact CB is formed between the adjacent gate structures SG1 and SG1 disposed at one end portion of a column of the memory cell MC. The bit line contact CB reaches from a top face of the inter-layer insulating film 17 to the surface of the semiconductor substrate 1. As described above, the bit line contacts CB are alternately disposed in a zigzag pattern in plan view. In FIG. 3, the bit line contact CB is formed in a location shifted to the right side. The source line contact CS is formed between the adjacent gate structures SG2 and SG2 disposed at the other end part of the column of the memory cell MC. The source line contact CS reaches from the top face of the inter-layer insulating film 17 to the surface of the semiconductor substrate 1 so as to cross a lower portion of the bit line BL. The structure illustrated in FIG. 3 is one example.

Next, a pattern forming method is described with an example of a case where a NAND flash-memory device is formed. FIG. 4A to FIG. 4H are partial cross-sectional views schematically illustrating an exemplary pattern forming method according to the first embodiment. Here, a partial area where the word lines WL are disposed in the line-and-space pattern between the selection gate lines SGL1 and SGL2 (hereinafter referred to as SGL) of the one memory unit Su is illustrated.

First, a tunnel insulating film and a floating gate electrode film are formed on a semiconductor substrate of a predetermined conductive type such as a silicon substrate. With a photolithography technique and an etching technique such as an RIE technique, trenches leading to the semiconductor substrate are formed. The trenches extend in the Y direction (bit line direction) and are formed at a predetermined spacing in the X direction (word line direction). Then, an insulating film such as a silicon oxide film is embedded in the trench to form a STI. Subsequently, an inter-electrode insulating film is formed over the entire surface of the semiconductor substrate. Use of the photolithography technique and the etching technique forms openings at areas where the selection gate lines SGL1 and SGL2 are formed. The opening passes through the inter-electrode insulating film. Then, a control gate electrode film is formed over the entire surface of the semiconductor substrate. The process objects are the tunnel insulating film, the floating gate electrode film, the inter-electrode insulating film, and the control gate electrode film 14, which are formed on the semiconductor substrate. However, in the following cross-sectional views, only the control gate electrode film 14 at the uppermost layer is illustrated as the process object for explanation. As the control gate electrode film 14, Si is used.

Figure 4A:
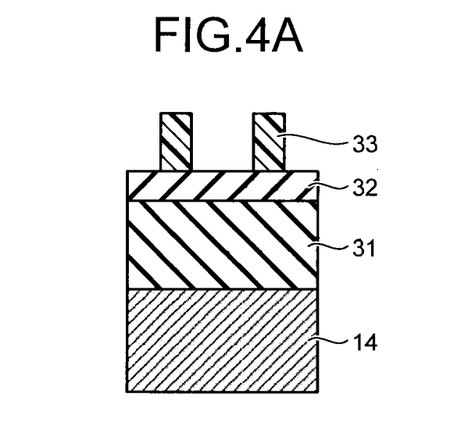
FIG. 4A to FIG. 4H are partial cross-sectional views schematically illustrating an exemplary pattern forming method according to a first embodiment.

Next, as illustrated in FIG. 4A, a hard mask layer 31 and a antireflection film 32 are stacked in this order on the entire surface of the process object (the control gate electrode film 14). As the hard mask layer 31, for example, a Spin On Carbon (SOC) film may be used. As the antireflection film 32, a Spin On Glass (SOG) film may be used. Furthermore, a resist is applied over the antireflection film 32. A core pattern 33 is formed using the lithography technique. The core pattern 33 includes a resist pattern patterned such that line patterns extending in the X direction have patterns disposed at a predetermined spacing in the line-and-space pattern (periodic pattern) in the Y direction.

Figure 4B:
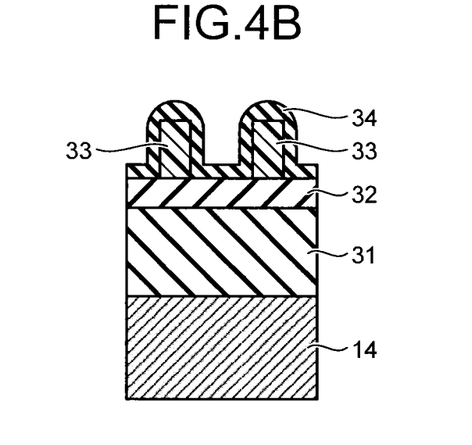

Thereafter, as illustrated in FIG. 4B, a spacer (sidewall) film 34 is formed on the antireflection film 32 and the core pattern 33. The spacer film 34 is formed so as to conformally cover the core pattern 33. As the spacer film 34, for example, a $SiO_2$ film may be used. To avoid thermal denaturation of the resist pattern during formation of the spacer film 34, it is desired that the spacer film 34 be formed at a low temperature. The spacer film 34, for example, is formed in a range of 25 to 100° C. using an Atomic Layer Deposition (ALD) method.

Figure 4C:
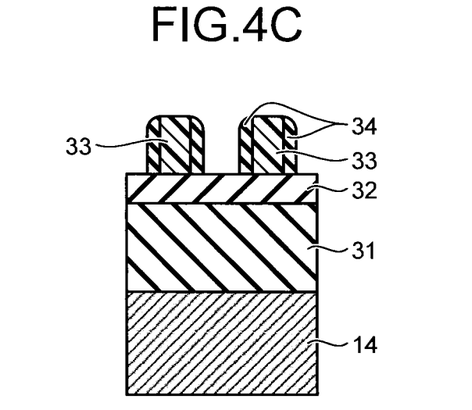

Next, as illustrated in FIG. 4C, the spacer film 34 is etchbacked until the top face of the core pattern 33 and the top face of the antireflection film 32 between the core patterns 33 are exposed by anisotropic etching such as a Reactive Ion Etching (RIE) method. Therefore, the loop-shaped spacer films 34 are formed around the core pattern 33.

Figure 4D:
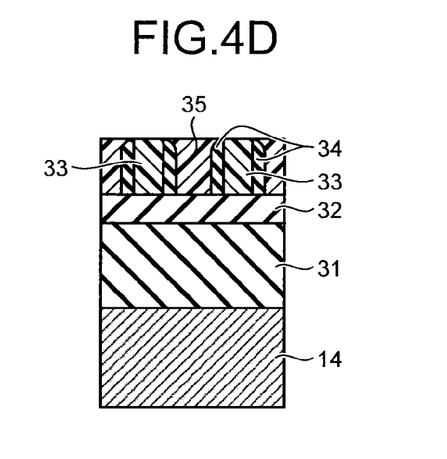

Thereafter, as illustrated in FIG. 4D, embedded films 35 are formed on the antireflection film 32 so as to be embedded between the core patterns 33 whose peripheral area is surrounded by the spacer films 34 and cover the core patterns 33 whose peripheral area is surrounded by the spacer films 34. As the embedded film 35, for example, an SOC film may be used. This embedded film 35 can be formed, for example, by applying a resin solution for forming an SOC film over the antireflection film 32 by a spin-coating method and baking the resin solution. Here, the resin solution typically includes a resin for forming an embedded film, a thermal acid generating agent, and a cross-linking agent. The resin for forming an embedded film is a principal resin for constituting the embedded film 35. The thermal acid generating agent generates acid by heat. The cross-linking agent progresses a crosslinkable reaction with acid (the principal resin itself may also serve as a cross-linking agent).

Figure 5:
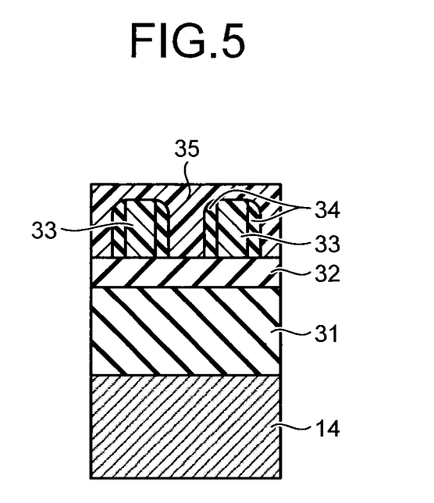
FIG. 5 is a partial cross-sectional view schematically illustrating another exemplary forming state of an embedded film.

FIG. 5 is a partial cross-sectional view schematically illustrating another exemplary forming state of an embedded film. In FIG. 4D, the top face of the embedded film 35 has approximately the same height as the core pattern 33 whose peripheral area is surrounded by the spacer films 34. However, as illustrated in FIG. 5, the top face of the embedded film 35 may be higher than the top face of the core pattern 33 whose peripheral area is surrounded by the spacer films 34. That is, the core pattern 33 whose peripheral area is surrounded by the spacer films 34 may be embedded by the embedded film 35.

Figure 4E:
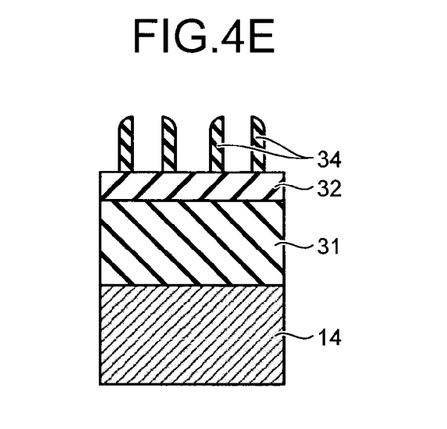

Thereafter, as illustrated in FIG. 4E, the core pattern 33 and the embedded film 35 are removed by an organic material removal technique (Asher) using, for example, an oxygen radical. Since both the resist pattern and the SOC film are organic films, they are turned into ashes by the oxygen radical, thus allowing simultaneous removal. Thereby, the loop-shaped spacer films 34 (spacer patterns) are formed on the antireflection film 32. The spacer films 34 are left in a state of approximately orthogonal to a substrate face (face of the antireflection film 32).

Here, the core pattern 33 is formed inside the loop-shaped spacer film 34, and the embedded films 35 are formed outside of the spacer film 34. Thus, stress is applied similarly to both sides of the spacer film 34. Therefore, during an organic material removal process, stresses applied to the outside and the inside of the spacer film 34 are approximately equal, thus preventing inclination of the spacer film 34. That is, the loop-shaped spacer film 34 is left in a state orthogonal to the substrate face.

Figure 4F:
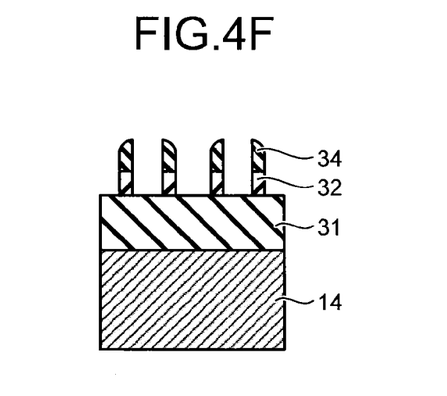

Next, as illustrated in FIG. 4F, using the spacer films 34 as a mask, the antireflection film 32 is processed by anisotropic etching such as a RIE method. Thus, a loop-shaped pattern is transferred to the antireflection film 32.

Figure 4G:
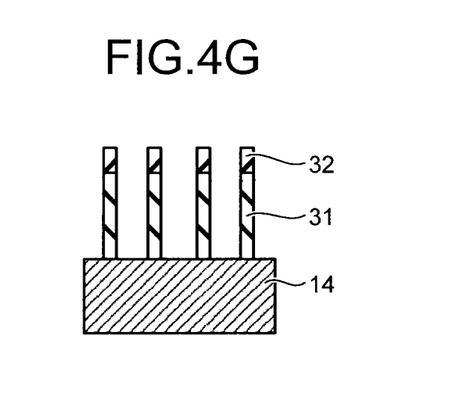

Further, as illustrated in FIG. 4G, using the patterned antireflection film 32 as a mask, the hard mask layer 31 is processed by anisotropic etching such as a RIE method. Thus, the loop-shaped pattern is transferred to the hard mask layer 31. Accordingly, the antireflection film 32 and the hard mask layer 31 form mask patterns disposed at a predetermined spacing in the Y direction. The mask patterns are loop-shaped patterns where both end portions of a pair of line patterns extending in the X direction are coupled.

As illustrated in FIG. 4G, the resist pattern has a structure vertically standing with respect to the substrate face. Therefore, the mask pattern is not inclined or obstructed, thus a satisfactory pattern is formed.

In this state, the mask pattern has a closed-loop structure, and the end parts of the pair of adjacent line patterns (parts that become the word lines WL) in the X direction are coupled. Therefore, a resist is applied over the entire face of the semiconductor substrate. A resist pattern is formed by lithography technique so as to cover the mask pattern for forming the word line excluding the end portions in the X direction. Then, the end portions of the mask pattern for forming the word line in the X direction are removed by anisotropic etching process such as a RIE method. Thus, the mask patterns for forming the word line arranged in the well-regulated line-and-space pattern are obtained.

Figure 4H:
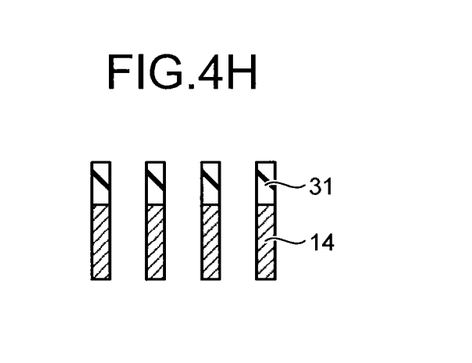

Thereafter, as illustrated in FIG. 4H, using the mask pattern for forming the word line as a mask, the process object is etched by anisotropic etching, for example, a RIE method.

The word lines WL (stacked gate structures) extending in the X direction and arranged at a predetermined spacing in the Y direction are formed.

As described above, since the process object is processed using the mask pattern orthogonal to the substrate face, a pattern formed on the process object is also formed satisfactorily.

In the first embodiment, the core pattern 33 is formed using a resist. The embedded films 35 formed of organic film are embedded between the core patterns 33 whose peripheral areas are surrounded by the spacer films 34. Then, the core patterns 33 and the embedded films 35 are removed simultaneously by ash process using the oxygen radical. Accordingly, a similar amount of stress is applied to the outside and the inside of the loop-shaped spacer film 34. Thus, in removal of the core patterns 33 and the embedded films 35, the spacer film 34 is not deformed, obstructed, nor fallen over, thus achieving a state of vertically standing with respect to the substrate face. As a result, processing the spacer film 34 as a mask, an effect of properly forming the pattern on the process object is achieved.

Conventionally, considering the deformation or falling of the spacer film 34, a thickness of the hard mask layer 31 where the process object can be processed in that state was sought. However, according to the method of the first embodiment, the deformation or falling of the spacer film 34 needs not to be considered. This achieves the thinner hard mask layer 31 than the conventional one.

Conventionally, to allow processing an underlayer film even when the spacer film 34 is inclined, a thickness of a core film (resist film) was configured with a sufficient margin. However, according to the method of the first embodiment, the inclination of the core film needs not to be considered. The core film can be thinner by the amount of sufficient margin for the inclined spacer film 34.

Consequently, a usage amount of a material for a process can be reduced. This also has an effect of reducing a production cost of a semiconductor device.

(Second Embodiment)

The first embodiment uses the SOC film as the embedded film. In the second embodiment, a case where a resist is used as an embedded film is described.

The procedure of a pattern forming method and a method of manufacturing a semiconductor device according to the second embodiment are approximately similar to the procedure of the pattern forming method and the method of manufacturing the semiconductor device according to the first embodiment. The following describes portions different from the first embodiment.

In formation of the embedded film 35 in FIG. 4D, a resist is used instead of the SOC film. Here, as the resist, a resist that is the same type as the resist used for forming the core pattern 33 in FIG. 4A is used. In the case where, for example, a positive resist is used as the core pattern 33 in FIG. 4A, a positive resist is used also as the embedded film 35. In the case where a negative resist is used as the core pattern 33 in FIG. 4A, a negative resist is used also as the embedded film 35.

In removal of the core pattern 33 and the embedded film 35 in FIG. 4E, exposure (if necessary, Post Exposure Bake (PEB)) and development are performed. As a developer, for example, Tetramethylammonium hydroxide (TMAH) may be used. Thus, removing the film by exposure and development reduces occurrence of remnants or dust compared with the removal using the organic material removal apparatus according to the first embodiment. The other processes are similar to the processes of the first embodiment.

In the second embodiment, the embedded film 35 is formed using the resist that is the same type as the resist constituting the core pattern 33. This allows removing the embedded film 35 and the core pattern 33 by exposure and development. As a result, this achieves an effect of easily removing the embedded film 35 and the core pattern 33 compared with the case of using the organic material removal apparatus. Compared with the case of using the organic material removal apparatus, an effect of restricting removal remnants or generation of dust is also achieved.

In the first embodiment, in the case where the embedded film 35 is embedded to a space pattern smaller than a resolution limit of an ArF immersion exposure device, embedding characteristics differ depending on a molecular weight of a principal resin in the resin solution forming the embedded film 35. When the molecular weight of the resin for forming an embedded film is equal to or less than 5,000, the embedding characteristics of the embedded film 35 are excellent. Consequently, generation of a void between the spacer film 34 and the embedded film 35 is reduced, and stress is applied to both the inside and the outside of the spacer film 34. This avoids inclination of the spacer film 34 in removal of the core pattern 33 and the embedded film 35. Accordingly, to form the SOC film, the molecular weight of the resin for forming an embedded film is preferred to be equal to or less than 5,000. This is true of a case where a resist is used like the second embodiment.

(Third Embodiment)

In the first and the second embodiments, the embedded film is formed outside of the loop-shaped spacer film to apply equal stress to the inside and the outside of the spacer film. In the third embodiment, the case where large stress is applied to the outside of the spacer film compared with the first and the second embodiments will be described.

Figure 6A:
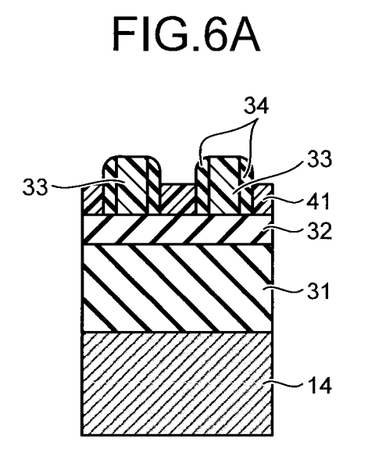
FIGS. 6A and 6B are cross-sectional views schematically illustrating an exemplary procedure of a pattern forming method according to a third embodiment.
Figure 6B:
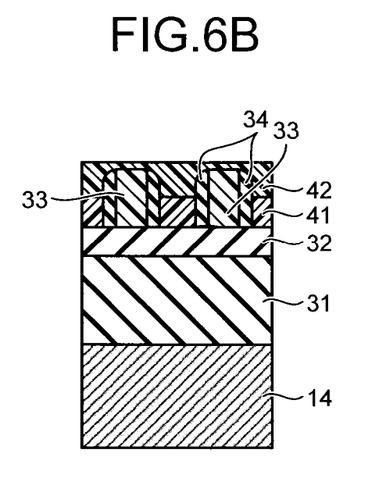

FIGS. 6A and 6B are cross-sectional views schematically illustrating an exemplary procedure of a pattern forming method according to the third embodiment. Up to the formation of the loop-shaped spacer film 34 around the core pattern 33, the process is similar to those in FIG. 4A to FIG. 4C of the first embodiment.

Thereafter, as illustrated in FIG. 6A, a first embedded film 41, which is made of an organic film, is formed. The first embedded film 41 coats between the core patterns 33 whose peripheral areas are surrounded by the spacer films 34. The first embedded film 41 is constituted of an organic film whose volume is shrunk by applying heat or irradiating light during formation of the film. As a material whose volume is shrunk by applying heat, polystyrene, methyl methacrylate, polyethylene terephthalate, diallyl phthalate, or a similar material can be used. As a material whose volume is shrunk by irradiating light, azobenzene derivative or a similar material can be used. It is only necessary that the first embedded film 41 has a film thickness so as to coat the top surface of the antireflection film 32 between the spacer films 34. The first embedded film 41 can be formed, for example, by applying a resin solution for forming the first embedded film over the antireflection film 32 using a spin-coating method, and then by baking the resin solution.

Then, as illustrated in FIG. 6B, a second embedded film 42, which is made of an organic film, is formed stacked on the first embedded film 41. The organic film has a large amount of volume shrinkage (degree of shrinkage) by applying heat or irradiating light in formation of the film compared with the first embedded film 41. As a material whose volume is shrunk by applying heat, polystyrene, methyl methacrylate, polyethylene terephthalate, diallyl phthalate, or a similar material can be used. As a material whose volume is shrunk by irradiating light, azobenzene derivative or a similar material can be employed. It is only necessary that the second embedded film 42 has a thickness to coat the above of the top surfaces of the spacer films 34. The second embedded film 42 can be formed, for example, by applying a resin solution for forming the second embedded film over the first embedded film 41 using a spin-coating method, and then by baking the resin solution.

In a baking process (or in light irradiation) of the second embedded film 42, the second embedded film 42 has large amount of shrinkage (degree of shrinkage) compared with the first embedded film 41. Accordingly, the spacer film 34 is put in a state on which a tensioning force toward the second embedded film 42 acts. This means that the more the spacer film 34 is prone to incline inward, the upper the portion goes. Accordingly, embedding the upper portion of the spacer film 34 in the second embedded film 42 with a large amount of shrinkage (degree of shrinkage) reduces tendency of being inclined inward.

While in this example, the case where two kinds of embedded films are stacked is described, three or more kinds of embedded films may be stacked. In the case where three or more kinds of embedded films are stacked, it is preferred that the greater the degree of shrinkage be, the more upper-level the embedded film is. This is because that the bottom portion of the spacer film 34 closely contacts the surface of the film to be processed. Accordingly, the more the amount of shrinkage is increased, the upper-level of the embedded films where the spacer film 34 is liable to move it goes. This increases the effectiveness of preventing inclination. While in the above-described example each embedded film is individually formed, a plurality of layers of embedded film may be stacked by dissolving the respective embedded films in the same solvent and separating the embedded films into the film thickness direction after application.

Thereafter, the core pattern 33, the first embedded film 41, and the second embedded film 42 are removed by an asher using, for example, an oxygen radical. Since the resist pattern, which constitutes the core pattern 33, and the first embedded film 41 and the second embedded film 42 are organic films, they are turned into ashes by the oxygen radical, thus allowing simultaneous removal. This forms the loop-shaped spacer films 34 (spacer patterns) on the antireflection film 32. The spacer films 34 are left in a state of approximately orthogonal to a substrate face (face of the antireflection film 32) as illustrated in FIG. 4E.

Thereafter, as illustrated in FIG. 4F or the subsequent drawings of the first embodiment, using the spacer film 34 (spacer pattern) as a mask, the process object is processed by anisotropic etching, for example, a RIE method.

In the third embodiment, the core pattern 33 is formed using a resist. Between the core patterns 33 whose peripheral areas are surrounded by the spacer film 34, the embedded films 41 and 42 of types having different degree of shrinkage by applying heat or irradiating light are stacked. Then, the core patterns 33 and the embedded films 41 and 42 are removed simultaneously by ash process using the oxygen radical. Thus, in removal of the core patterns 33 and the embedded films 41 and 42, the spacer film 34 is not deformed, fallen over toward the inside, nor obstructed, thus achieving a state of vertically (or approximately orthogonal) standing with respect to the substrate face. As a result, by processing the spacer film 34 as a mask, it is possible to properly form the pattern on the process object.

(Fourth Embodiment)

In the third embodiment, the core pattern and the plurality of stacked embedded films are simultaneously removed. However, in the fourth embodiment, a method for removing a plurality of stacked embedded films after removing the core pattern will be described.

Figure 7A:
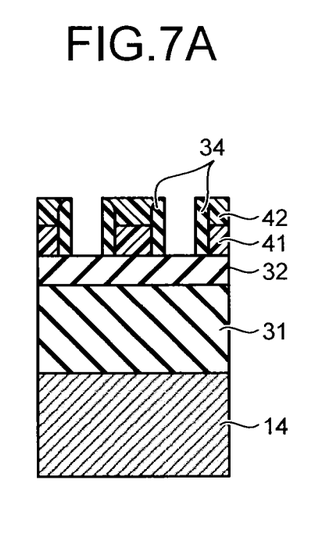
FIGS. 7A and 7B are cross-sectional views schematically illustrating an exemplary procedure of a pattern forming method according to a fourth embodiment.
Figure 7B:
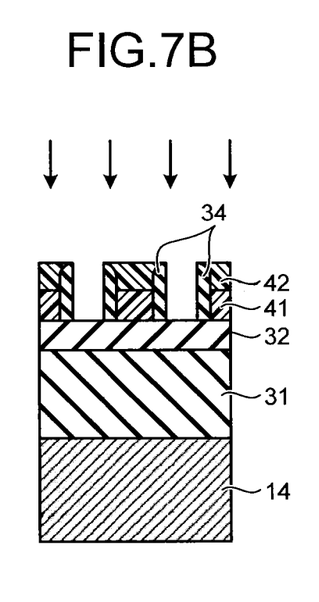

FIGS. 7A and 7B are cross-sectional views schematically illustrating an exemplary procedure of a pattern forming method according to the fourth embodiment. Up to formation of a plurality of stacked embedded films, which have different degree of shrinkage by applying heat or irradiating light (in this example, stacked films of the first embedded film 41 and the second embedded film 42 made of an organic film, which has a large degree of shrinkage by applying heat or irradiating light compared with the first embedded film 41) between the core patterns 33 whose peripheral areas are surrounded by the spacer films 34, the process is similar to FIG. 4A to FIG. 4C of the first embodiment and FIG. 6B of the third embodiment. However, for the first embedded film 41 and the second embedded film 42, a material that increases its molecular weights by crosslinkable reaction generated by applying heat or irradiating light and therefore is difficult to be dissolved in solvent is used. For the solvent for forming the embedded film before cross-linking, a solvent other than cyclohexanone is used so as not to dissolve the core pattern at the point of spin-coating.

Then, as illustrated in FIG. 7A, only the core pattern 33 is dissolved. Using a solution not dissolving the first embedded film 41 and the second embedded film 42, only the core pattern 33 is removed. For example, in the case where the core pattern 33 is formed of a resist, the first embedded film 41 is formed of novolac-based resin, and the second embedded film 42 is formed of naphthalene-based resin, cyclohexanone can be used as a solution for the films.

Thereafter, as illustrated in FIG. 7B, heat is applied or light is irradiated on the first embedded film 41 and the second embedded film 42 to shrink the first embedded film 41 and the second embedded film 42. By removing the core pattern 33 first, the spacer film 34 can be further effectively pulled from the outside by the subsequent heat application process or light irradiation process. At this time, by changing a period of the heat application or the light irradiation in accordance with the degree of inclination of the spacer film 34, the angle of the inclined spacer film 34 with respect to the substrate face can be a desired angle (approximately orthogonal).

Thereafter, the first embedded film 41 and the second embedded film 42 are removed by an asher using, for example, an oxygen radical. As illustrated in FIG. 4E, this forms the loop-shaped spacer films 34 (spacer patterns) on the antireflection film 32. The spacer films 34 are left in a state of approximately orthogonal to a substrate face (face of the antireflection film 32).

Thereafter, as illustrated in FIG. 4F or the subsequent drawings of the first embodiment, using the spacer film 34 (spacer pattern) as a mask, the process object is processed by anisotropic etching, for example, a RIE method.

In the fourth embodiment, the core pattern 33 is formed using a resist. Between the core patterns 33 whose peripheral areas are surrounded by the spacer film 34, the embedded films 41 and 42 of types having different degree of shrinkage by applying heat or irradiating light are stacked. Only the core pattern 33 is removed. Then heat is applied or light is irradiated on the embedded films 41 and 42 for shrinkage, and the spacer films 34 are pulled outside. Then, the embedded films 41 and 42 are removed by ash process using the oxygen radical. Accordingly, even if the spacer film 34 inclines inside during removal of the core pattern 33, it is possible to make the spacer film 34 be in a state of vertically (or approximately orthogonal) standing with respect to the substrate face. As a result, the spacer film 34 is not deformed, fallen over toward the inside, nor obstructed. Therefore, by processing the spacer film 34 as a mask, it is possible to properly form the pattern on the process object.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
    forming a hard mask layer above a process object;
    forming a core pattern with a predetermined shape above the hard mask layer;
    forming a spacer film above the hard mask layer where the core pattern is formed;
    etching back the spacer film such that a top face of the core pattern is exposed and a top face of the hard mask layer between the core patterns is exposed;
    forming an embedded layer above the hard mask layer so as to embed between the core patterns whose peripheral areas are surrounded by the spacer film;
    removing the core pattern and the embedded layer simultaneously to form a spacer pattern including the spacer film;
    processing the hard mask layer using the spacer pattern as a mask; and
    forming a pattern on the process object using the processed hard mask layer as a mask,
    wherein,
    in the formation of the embedded layer, a plurality of layers of embedded films are stacked, the embedded films being formed of organic films having different degree of shrinkage by irradiating light or applying heat, and
    in the plurality of layers of embedded films, an upper embedded film has a larger degree of the shrinkage than a degree of the shrinkage of a lowest embedded film.

2. The pattern forming method according to claim 1, whereinin the formation of the embedded layer, processes of applying a resin solution forming the embedded layer above the hard mask layer and drying the resin solution are performed on each of the embedded films.

3. The pattern forming method according to claim 1, wherein the formation of the embedded layer includes
    applying a resin solution forming the embedded layer above the hard mask layer, the embedded films including a plurality of the organic films having a different degree of the shrinkage,
    making the organic films having a different degree of the shrinkage separate in a thickness direction of the embedded layers, and
    drying the embedded layer.

4. The pattern forming method according to claim 1, wherein
    in the formation of the embedded layer, light is irradiated or heat is applied on the embedded film during formation of the embedded film.

5. A pattern forming method, comprising:
    forming a hard mask layer above a process object;
    forming a core pattern with a predetermined shape above the hard mask layer;
    forming a spacer film above the hard mask layer where the core pattern is formed;
    etching back the spacer film such that a top face of the core pattern is exposed and a top face of the hard mask layer between the core patterns is exposed;
    forming embedded layers with a plurality of layers made of organic films above the hard mask layer so as to embed between the core patterns whose peripheral areas are surrounded by the spacer film, the organic films having a different degree of shrinkage by irradiating light or applying heat;
    removing the core pattern;
    shrinking the embedded layer by irradiating light or applying heat on the embedded layer;
    removing the embedded layer to form a spacer pattern including the spacer film;
    processing the hard mask layer using the spacer pattern as a mask; and
    forming a pattern on the process object using the processed hard mask layer as a mask.

6. The pattern forming method according to claim 5, wherein
    in the formation of the embedded layer, in the plurality of layers of embedded films, an upper embedded film has a larger degree of the shrinkage than a degree of the shrinkage of a lowest embedded film.

* * * * *